United States Patent
Merio

(10) Patent No.: US 7,245,892 B2
(45) Date of Patent: Jul. 17, 2007

(54) SATELLITE RECEPTION

(75) Inventor: Lauri Merio, Rusko (FI)

(73) Assignee: Nokia Corporation, Espoo (FI)

( * ) Notice: Subject to any disclaimer, the term of this patent is extended or adjusted under 35 U.S.C. 154(b) by 491 days.

(21) Appl. No.: 10/450,694

(22) PCT Filed: Dec. 19, 2001

(86) PCT No.: PCT/EP01/15068

§ 371 (c)(1),
(2), (4) Date: Nov. 21, 2003

(87) PCT Pub. No.: WO02/51015

PCT Pub. Date: Jun. 27, 2002

(65) Prior Publication Data

US 2004/0058642 A1 Mar. 25, 2004

(30) Foreign Application Priority Data

Dec. 19, 2000 (GB) .................................. 0030965.8

(51) Int. Cl.
*H04B 1/16* (2006.01)

(52) U.S. Cl. .................. 455/209; 455/3.02; 455/191.2; 455/339

(58) Field of Classification Search .............. 455/3.02, 455/428, 430, 427, 131, 146, 147, 188.1, 455/189.1, 190.1, 191.1, 191.2, 205, 206, 455/209, 334, 339, 341; 342/361, 362, 365
See application file for complete search history.

(56) References Cited

U.S. PATENT DOCUMENTS

| | | | | |
|---|---|---|---|---|
| 4,792,993 A * | 12/1988 | Ma | ............................. | 455/266 |
| 5,805,975 A | 9/1998 | Coker et al. | ................. | 455/3.2 |
| 5,959,592 A * | 9/1999 | Petruzzelli | ................... | 725/68 |
| 6,728,513 B1 * | 4/2004 | Nishina | ...................... | 455/3.02 |
| 6,832,071 B1 * | 12/2004 | Nakamura et al. | ......... | 455/3.02 |
| 6,985,695 B1 * | 1/2006 | Kato | ......................... | 455/3.02 |

FOREIGN PATENT DOCUMENTS

| | | |
|---|---|---|
| DE | 4126774 A | 2/1993 |
| DE | 4128947 A | 3/1993 |
| DE | 9306499 U | 7/1993 |
| DE | 4243967 A | 7/1994 |
| DE | 43 35 617 A1 | 4/1995 |
| EP | 0 300 173 A2 | 1/1989 |
| EP | 0 800 314 A1 | 10/1997 |
| GB | 2 214 014 A | 8/1989 |
| GB | 2 258 359 A | 2/1993 |

* cited by examiner

*Primary Examiner*—Edward F. Urban
*Assistant Examiner*—Nhan T. Le
(74) *Attorney, Agent, or Firm*—Harrington & Smith, PC

(57) ABSTRACT

A typical satellite reception system comprises a satellite dish, a low noise block (LNB) and a satellite receiver. The low noise block converts the received signals into lower frequency signals which are fed to the satellite receiver. It is now becoming increasingly desirable for STBs to be fitted with two or more tuners, each having an associated receiver/decoder. This is to allow, for example, a user to watch a satellite television program whilst recording, on a video recorder, a different satellite television channel. However, since a single LNB can only supply signals from either a vertically or horizontally polarised signal, it is not possible to use a single LNB to provide all the desired portions of the incoming satellite signal.

18 Claims, 4 Drawing Sheets

SATELLITE RECEPTION

The present invention relates to satellite receiver systems and, more particularly, to the supply of signals from a satellite dish to a satellite receiver.

A typical satellite reception system comprises a satellite dish, a low noise block (LNB) and a satellite receiver. The satellite dish is pointed towards a satellite whose signals are to be received. The low noise block converts the received signals into lower frequency signals which are fed to the satellite receiver where decoding of the signals takes place.

A low noise block typically comprises a low noise amplifier and a downconverter. For maximum effectiveness the LNB must be located as near to the antenna or satellite dish as possible. These signals are converted from satellite frequencies, typically in the range 10.7 to 12.75 GHz, by the low noise block to an intermediate frequency (IF) range, typically in the range of 950 to 2150 MHz. This conversion is necessary to enable the received signals to be carried from the satellite dish through co-axial cable to a suitable receiver without undue loss. Typically the satellite dish is located some distance from the receiver, such as on a roof or on the side of a building, whereas the receiver is typically located in an interior location, typically in close proximity to a television set.

The output from the LNB is generally fed as a direct input to set-top-box. A set-top-box comprises a tuner, which tunes to a desired frequency of the input signal, and a receiver/decoder which receives and decodes the signal at the tuned frequency.

To increase the capacity of satellite transmissions a polarisation scheme is commonly used. In linear cross polarisation, half of the satellite transponders transmit their signals in a vertically polarised mode, and the other half of the transponders transmit their signals in a horizontally polarised mode. Both sets of frequencies overlap but, since they are 90 degrees out of phase, they do not interfere with each other. In order to receive and decode these signals LNBs need a polariser to select either the horizontally or vertically polarised signals. Other polarisation techniques exist, such as left-hand and right-hand circular polarisation, although the principles remain the same.

A typical digital video broadcasting (DVB) set-top-box (STB) contains a single tuner which feeds a receiver/decoder. Depending on the television channel which is to be decoded, the tuner tunes to the particular frequency at which that channel is located. The STB also knows whether that channel is broadcast with vertical or horizontal polarisation. In order to select the required polarisation, the STB sends a control signal up the same coaxial cable which supplies the downconverter signals from the satellite dish to control the polariser on the LNB. In this way, a STB may receive and decode any programme from the received satellite signals.

It is now becoming increasingly desirable for STBs to be fitted with two or more tuners, each having an associated receiver/decoder. This is to allow, for example, a user to watch a satellite television program whilst recording, on a video recorder, a different satellite television channel. However, since a single LNB can only supply signals from either a vertically or horizontally polarised signal, it is not possible to use a single LNB to provide all the desired portions of the incoming satellite signal.

At present, the only solution to this problem is to use a separate LNB for each tuner. This is undesirable from both a cost and an installation perspective, especially as two sets of cabling are required. This is particularly disadvantageous given the distances between satellite dishes and set-top-boxes.

Accordingly, one aim of the present invention is to overcome at least some of the limitations exhibited by the prior art.

According to a first aspect of the present invention, there is provided apparatus for processing an input signal to produce an output signal, comprising: a selector for selecting a plurality of portions of interest of the input signal; a translator for translating each selected portion to respective adjacent predetermined frequency bands; and a combiner for combining each predetermined frequency band to produce the output signal.

According to a second aspect of the present invention, there is provided a method of processing an input signal to produce an output signal, comprising: selecting a plurality of portions of interest of the input signal; translating each selected portion to respective adjacent predetermined frequency bands; and combining each predetermined frequency band to produce the output signal.

According to a third aspect of the present invention, there is provided a system for processing an input signal to produce an output signal, the output signal being received by a receiver, comprising: a controller in the receiver for identifying a plurality of portions of interest of the input signal; a translator for translating each of said identified portions to respective predetermined adjacent frequency bands; and a combiner for combining each predetermined frequency band to produce the output signal.

This provides advantages over the prior art in that a single LNB according to the present invention can provide signals to a dual or multi-tuner receiver.

Additionally, an LNB according to the present invention advantageously provides a reduction in the amount of electronic hardware required compared to two independent LNBs by reducing unnecessary duplication of components.

The invention is based on the realisation that it is possible to split the received satellite signal into separate portions of interest and to combine each portion of interest onto a single output signal. Each portion of interest may be, for example, a desired individual frequency having a specific polarisation, or may be a frequency band containing a desired individual frequency having a specific polarisation. In this way, an output signal can be created which can contain signals transmitted from a satellite with both horizontally and vertically polarisation.

The invention will now be described, by way of example only, with reference to the accompanying diagrams, in which:

FIG. 1 is a block diagram of a low noise block 140 according to the prior art.

Figure 1:
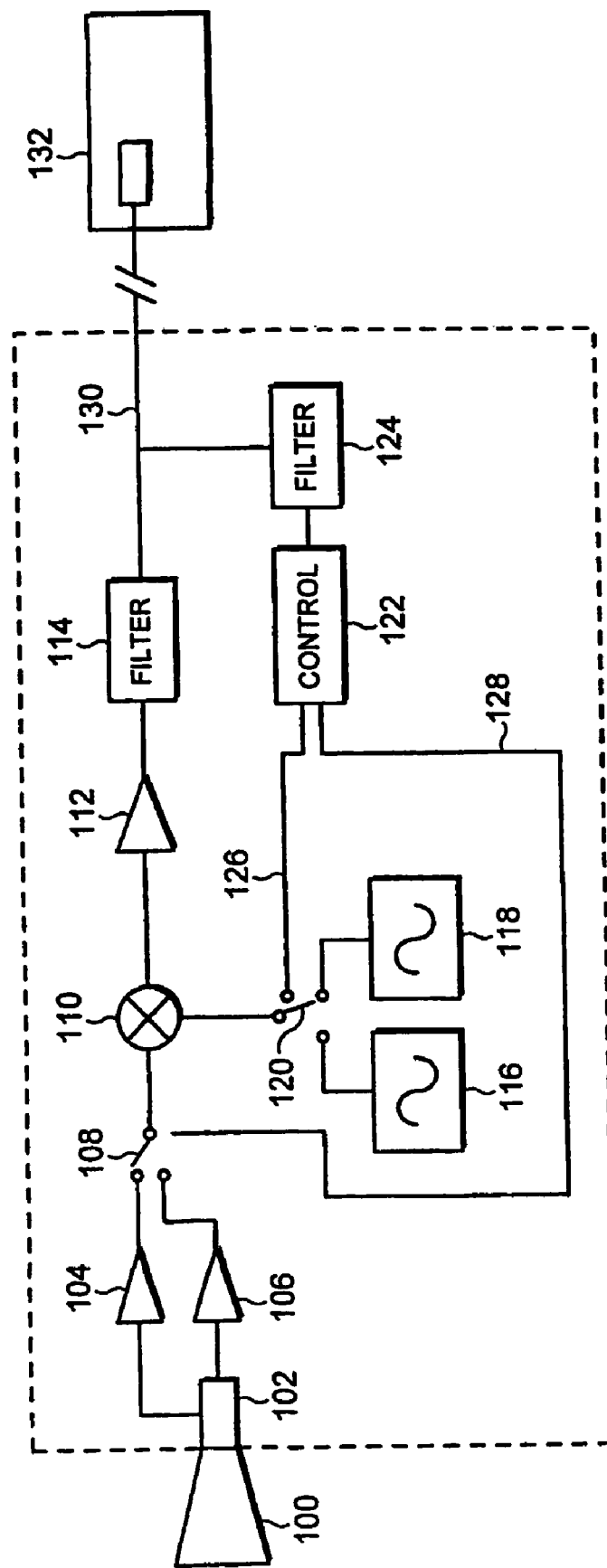
FIG. 1 is a block diagram of a low noise block according to the prior art.

An antenna 100 receives signals from a satellite (not shown). The received signal is typically in the range 10.7 to 12.75 GHz. A polariser 102 separates the horizontally and vertically polarised signals and feeds the vertically polarised signals to a low-noise amplifier 104 and feeds horizontally polarised signals to a low-noise amplifier 106. A polarisation switch 108 allows either the vertically or horizontally polarised signals to be selected. The switch 108 is controlled by a control signal 128 which is discussed further below. The selected signal is fed to a mixer 110 which converts the signal to an intermediate frequency (IF) band, typically in the range 950 to 2150 MHz. The conversion frequency (IF frequency) is the difference between an oscillator frequency and the frequency of the selected signal. Typically two oscillators 116 and 118 are used to cover the whole satellite frequency band. An oscillator selection switch 120 is used to control the selection of one of the oscillators according to the frequency of the selected signal. The switch is controlled by a control signal 126, described below. The downconverted signal is amplified by an amplifier 112 before being filtered by an IF filter 114. The output signal 130 is then fed, via coaxial cable, to the input of a set-top-box decoder 132, where the received signal can be decoded.

The set-top-box 132 can control the selection of the polarised signal and the oscillator selection by sending a control signal up the coaxial cable. The control signal is typically is a DC modulated 22 kHz signal. The control signal is separated by a control signal filter 124 and is interpreted by a controller 122. The controller 122 controls control signals 126 and 128 which control the polarisation switch 108 and the oscillator selection switch 120.

The output 130 of the LNB 140 provides signals only from a single polarisation. Therefore, it is not possible for the output signal to contain both vertically and horizontally polarised signals. In order to select between either vertically or horizontally polarised signals, depending on which signal is required by the set-top-box, the set-top-box 132 sends control signals to change the polarisation selection.

Figure 2:
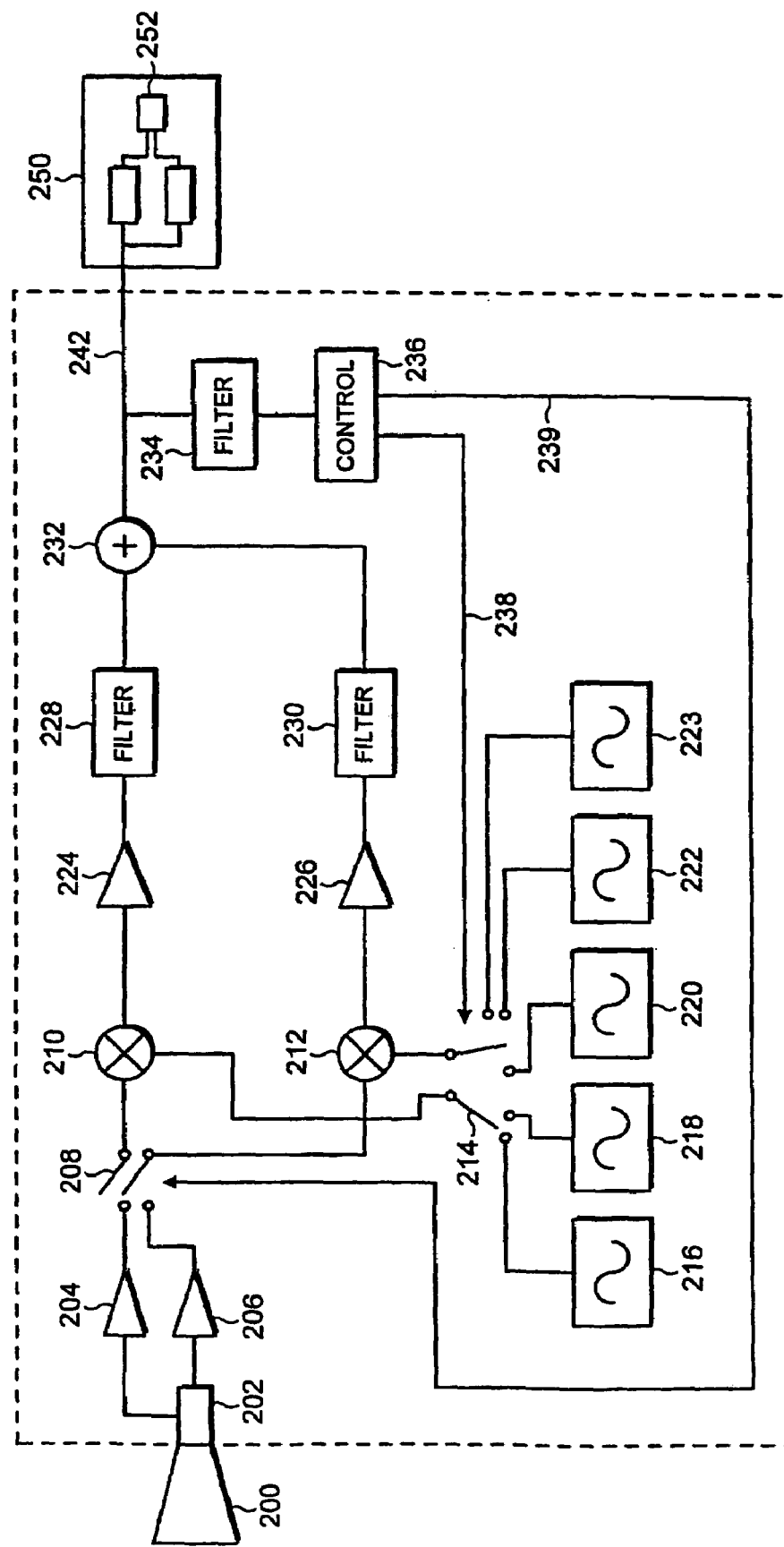
FIG. 2 is a block diagram of one embodiment according to the present invention.

FIG. 2 is a block diagram of one embodiment according to the present invention.

An antenna 200 receives signals from a satellite (not shown). A polariser 202 separates the horizontally and vertically polarised signals and feeds vertically polarised signals to a low-noise amplifier 204 and feeds horizontally polarised signals to a low-noise amplifier 206. A polarisation switch 208 provides two switchable outputs, which are controllable by a control signal 239, described below. Two separate processing paths process a respective output of the polarisation switch 208; the first path, referred to herein as the low band path, comprises a mixer 210, an amplifier 224 and an IF filter 228, and the second path, referred to herein as the high band path, comprises a mixer 212, an amplifier 226 and an IF filter 230. The switch 208 is such that each processing path can independently process either the horizontally or the vertically polarised signal.

The mixer 210 mixes the selected output from the polarisation switch 208 with a mixing signal from one of the oscillators 216, 218, 220, 222 and 223. This down-converts the selected input signal to a lower frequency which is dependent on the oscillator frequency with which it is mixed. The down-converted signal is filtered by a filter 228 to remove any unwanted signals.

The mixer 212 mixes the selected output from the polarisation switch 208 with a mixing signal from one of the oscillators 216, 218, 220, 222 and 223. This converts the selected input signal to a lower frequency which is dependent on the oscillator frequency with which it is mixed. The down-converted signal is filtered by a filter 230 to remove any unwanted signals. Preferably, the filters 228 and 230 are band pass filters.

The selection of which oscillator is used in each mixer is determined by a oscillator selection switch 214. The oscillator selection switch 214 enables any of the oscillators to be independently selected. A control signal 238 controls the oscillator selection switch 214, as described below.

The outputs of each of the two separate processing paths are combined in a combiner 232 to produce an output signal 242 which is fed to a dual or multi-tuner set-top-box 250. This combining is possible without causing interference since the range of frequencies output from filters 228 and 230 are non-overlapping. The set-top-box 250 also includes a controller 252. The controller controls the normal function of a set-top-box which would be apparent to those skilled in the art. The controller 252 also controls the tuners of the set-top-box.

Each tuner of the set-top-box 250 knows which part of the satellite signal it requires. Each tuner therefore is able to select a portion of interest of the satellite signal, the portion of interest containing the frequency and polarisation required by the tuner. For example, the first tuner may require a portion of interest having vertical polarisation at a frequency of 11.0 GHz, the second tuner may require a portion of interest having horizontal polarisation at a frequency of 12.0 GHz. The set-top-box 250 can control the signals it receives from the LNB by sending control signals, via the controller 252 up the coaxial cable. The control signal is preferably a DC modulated 22 kHz signal. The control signal is separated by a control signal filter 234 and then interpreted by a controller 236. The controller 236 controls control signals 239 and 238 which respectively control the polarisation switch 208 and the oscillator selection switch 214.

The present invention may also be used with, for example, two set-top-boxes, each having a single tuner. Since each set-top-box will operate independently, there may be occasions when control signals sent from each set-top-box coincide and may interfere with one another, preventing the control signals being received by the controller 236 of the LNB. One way in which this could be overcome would be for each set-top-box to send each control signal twice, separated with a short random delay. In this way, it is unlikely that both signals would coincide on both occasions. This problem does not occur in a single set-top-box having multiple tuners, since the controller of the set-top-box will ensure that only one control signal is sent at a time.

The control signals can take many forms, for example, they may specify the polarisation and the frequency of the required signal, which in turn would be interpreted by a controller 236. The controller 236 would then send appropriate control signals to ensure the correct polarisation and the correct oscillators are selected. The control signals may also indicate whether the tuner requires those signals to be at the low or the high band.

Further detail explaining the functioning of the present invention is given below with reference to an example, illustrated in FIG. 3.

Figure 3A:
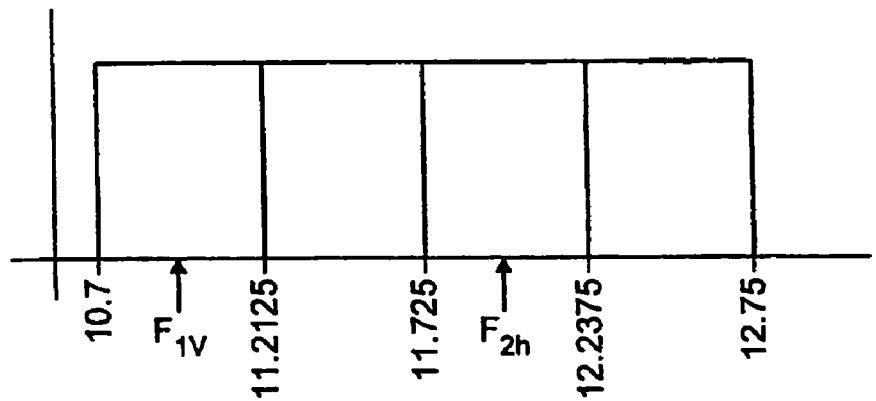
FIG. 3 shows the processing of an input signal to produce an output signal in accordance with one embodiment of the present invention.

The present invention effectively splits up the incoming satellite bandwidth of 10.7 to 12.75 GHz into a number of smaller bands as detailed below and as shown in FIG. 3a:

| Band 1 | 10.7-11.2125 GHz |
|---|---|
| Band 2 | 11.2125-11.725 GHz |
| Band 3 | 11.725-12.2375 GHz |
| Band 4 | 12.2375-12.75 GHz |

$F_1$ is a frequency required by a first tuner of the set-top-box 250 and $F_2$ is a frequency required by a second tuner of the set-top-box 250. In this example, $F_1$ is 10.95 GHz, $F_2$ is 11.98 GHz, as shown in FIG. 3a. For the sake of this example, $F_1$ is vertically polarised and $F_2$ is horizontally polarised.

The set-top box sends control signals up to the controller 236 indicating the original satellite frequencies and polarisations which are required by each tuner of the set-top-box 250. The controller 236 interprets the control signals and sends further control signals 238 and 239 to control the oscillator selection switch 214 and the polarisation switch 208 respectively.

The controller sets the polarisation selection switch to direct the vertically polarised signals along the low band path, 210, 224 and 228, and the horizontally polarised signals along the high band path 212, 226 and 230.

The oscillator selection switch is set to select an oscillator frequency according to the following tables:

TABLE 1

Oscillator Frequencies (Low Band)

| Oscillator Frequency | Frequency from Satellite | Frequency to receiver |
|---|---|---|
| 9.75 GHz | 10.7-11.2125 GHz | 0.95-1.4625 GHz |
| 10.2625 | 11.2125-11.725 | 0.95-1.4625 |
| 10.775 | 11.725-12.2375 | 0.95-1.4625 |
| 11.2875 | 12.2375-12.75 | 0.95-1.4625 |

TABLE 2

Oscillator Frequencies (High Band with 175 MHz Guard Band)

| Oscillator Frequency | Frequency from Satellite | Frequency to receiver |
|---|---|---|
| 9.0625 GHz | 10.7-11.2125 GHz | 1.6375-2.150 GHz |
| 9.575 | 11.2125-11.725 | 1.6375-2.150 |
| 10.0875 | 11.725-12.2375 | 1.6375-2.150 |
| 10.6 | 12.2375-12.75 | 1.6375-2.150 |

TABLE 3

Oscillator Frequencies (High Band with no Guard Band)

| Oscillator Frequency | Frequency from Satellite | Frequency to receiver |
|---|---|---|
| 9.2375 GHz | 10.7-11.2125 GHz | 1.4625-1.975 GHz |
| 9.75 | 11.2125-11.725 | 1.4625-1.975 |
| 10.2625 | 11.725-12.2375 | 1.4625-1.975 |
| 10.775 | 12.2375-12.75 | 1.4625-1.975 |

Although there are five oscillators 216, 218, 220, 222 and 223 shown in FIG. 2, the actual number may vary. For example, if oscillator frequencies as shown in Table 1 and Table 2 are used, a total of eight oscillators would be required. However, if oscillator frequencies as shown in Table 1 and Table 3 are used, only five oscillators would be required since the oscillator frequencies of 9.75, 10.2625 and 10.725 are shared. Those skilled in the art will appreciate that other numbers of oscillators may be required depending on the precise oscillator frequencies required.

For example, for the required frequency of 10.95 GHz in the low band, an oscillator frequency of 9.75 GHz is selected (from Table 1). For the required frequency of 11.98 GHz in the high band, an oscillator frequency of 10.0875 GHz is selected (from Table 2).

It should be noted that when two frequencies are mixed together, such as in mixers 210 and 212, two sets of frequencies are produced; one at $F_1+F_2$, the other, a reverse spectrum, at the absolute value of $F_1-F_2$. The repeat frequencies are generally sufficiently far away in frequency terms not to pose any problems. This effect may also be put to use in a beneficial way. For example, in Table 3 above, an oscillator frequency of 10.775 GHz is specified. However, this oscillator frequency falls within the received satellite frequency range of 10.75 to 12.75 GHz, and may cause interference. To overcome this problem, an oscillator frequency of 14.1215 GHz may be used instead of the oscillator frequency of 10.775 GHz. The oscillator frequency of 14.1215 GHz is outside of the received satellite frequency range, and will therefore not cause interference. This oscillator still produces the required frequency range, but produces an inverted spectrum. Providing the receiver is aware that it is receiving the inverted spectrum, the receiver can make suitable adjustments, for example to a frequency look-up table, to ensure that the correct frequency is received and decoded. Alternatively, the LNB may comprise additional circuitry to invert the inverted spectrum.

Figure 3B:
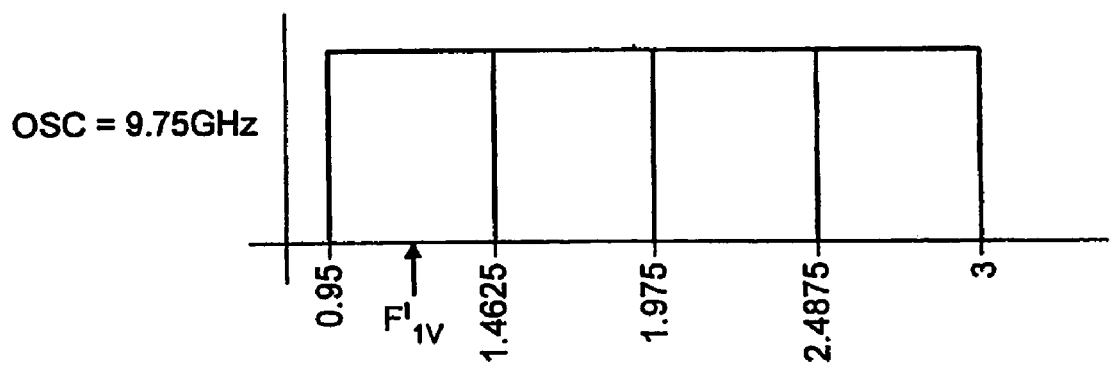

The mixer 210 mixes the vertically polarised signal with the chosen oscillator frequency of 9.75 GHz; this has the effect of reducing, or down-converting, the frequency of the input signal by 9.75 GHz. The effect of the down-converting is shown in FIG. 3b, which shows how frequency $F_1$ is translated to a lower frequency $F_1'$ of 1.2 GHz.

Figure 3C:
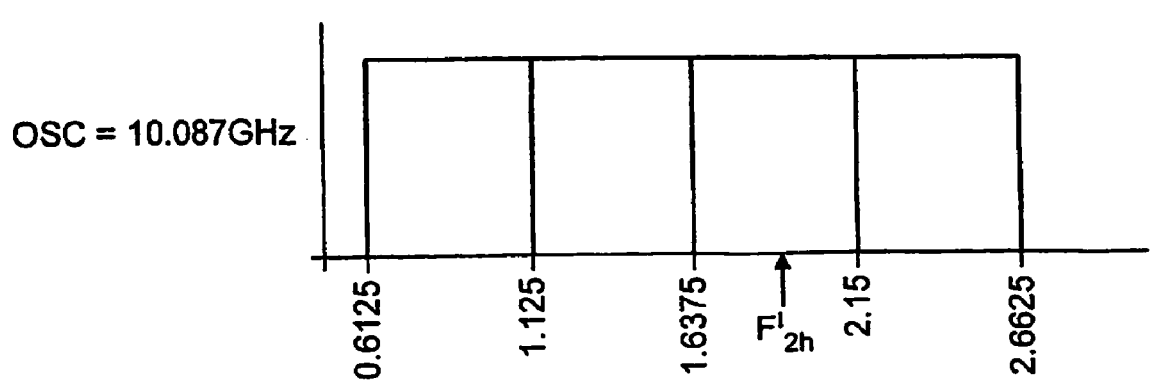

The mixer 212 mixes the horizontally polarised signal with the chosen oscillator frequency of 10.0875 GHz, which reduces the input signal by 10.0875 GHz. The effect is shown in FIG. 3c, which shows how frequency $F_2$ is translated to a lower frequency $F_2'$ of 1.89 GHz.

The outputs of mixers 210 and 212 are amplified by respective IF amplifiers 224 and 226.

Figure 3D:
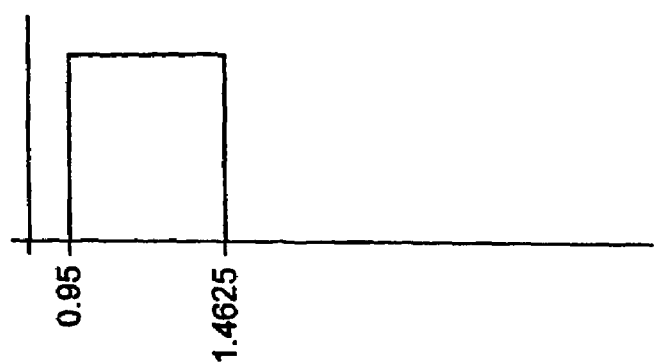
Figure 3E:
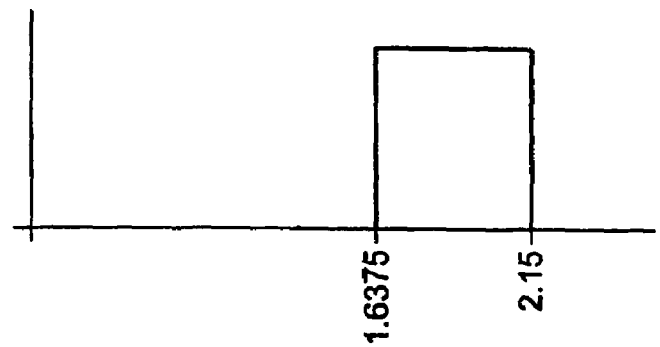

The output of IF amplifier 224 is filtered by the band pass filter 228 which removes substantially all frequencies outside the range of 0.95 to 1.4625 GHz, as shown in FIG. 3d. The output of IF amplifier 226 is filtered by the band pass filter 230 which removes substantially all frequencies outside the range of 1.6375 to 2.15 GHz, as shown in FIG. 3e. FIGS. 3d and 3e show the results of a perfect filter for the purposes of illustration. The precise values of the IF filters 228 and 230 will vary according to, amongst other things, the oscillator frequencies chosen, the input satellite frequencies, the receivers used, and whether a guard interval is present.

Figure 3F:
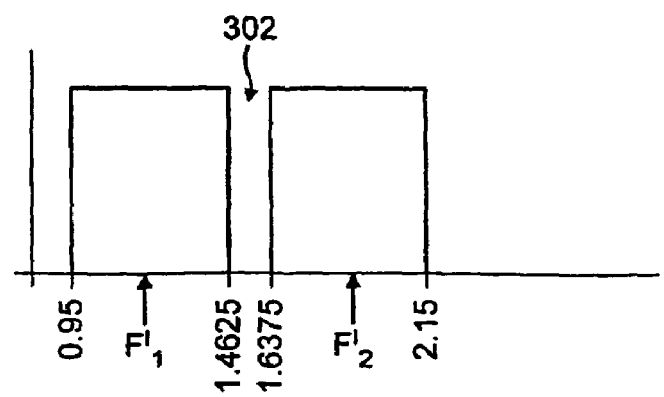

The result of the two processing paths are combined in the combiner 232 to produce an output signal as shown in FIG. 3f. Combination of the two signals as shown in FIGS. 3d and 3e is possible since the processing ensures that the two frequencies do not overlap. The output signal 242 is fed to the set-top-box 250 where the desired frequencies are available to the tuners at frequencies $F_1'$ and $F_2'$.

The present invention functions so that which ever combination of polarisation and satellite frequencies are required by the tuners, the output signal always contains the required frequencies.

In the above example, the selection of oscillator frequencies was made from Tables 1 and 2. The oscillator frequencies of Table 2 are chosen to provide a 175 MHz guard interval on th output signal 242 between the two different frequency bands. This guard interval 302 of FIG. 3f is preferred to enable suitable IF filters 228 and 230 to be used. Table 3 lists a set of oscillator frequencies which do not provide a guard interval. This may be desirable in certain situations although it does require higher order filters to reduce interference between the two bands. Those skilled in the art will appreciate that guard intervals other than 175 MHz may be chosen.

Depending on the configuration of the switches 208 and 214 the output signal 242 can contain any two of: low band vertical polarisation, low band horizontal polarisation, high band vertical polarisation, and high band horizontal polarisation. For example, the output signal can contain a high band vertically polarised signal and a low band horizontally polarised signal, or even a high band vertically polarised signal and a high band horizontal polarised signal. The LNB 240 according to the present invention can therefore supply a pair of tuners with whichever signals they require.

Those skilled in the art will appreciate that the present invention could be further enhanced by adding further processing paths and additional oscillators to enable supply signals to three or more tuners on a single output. Such enhancements, although not explicitly described herein, do not detract from the inventive concepts described above. Those skilled in the art will also appreciate that the invention is not limited for use with set-top-boxes, but can be used in any situation where it is desirable to supply signals to a tuner/receiver.

The invention claimed is:

1. Apparatus comprising:
a low noise block, the low noise block being operable to receive a satellite signal at satellite frequencies, to process the received signal and to produce an output intermediate frequency signal, the low noise block comprising:
a selector, the selector comprising a receiver for receiving, from an external device, an indication of a plurality of portions of interest of the received satellite signal at satellite frequencies, and being arranged for selecting said plurality of portions of interest of the input signal;
a translator, the translator being arranged for translating each of said plurality of selected portions to respective adjacent predetermined frequency bands; and
a combiner, the combiner being arranged for combining each of said predetermined frequency bands to produce said output intermediate frequency signal.

2. The apparatus of claim 1, wherein the received satellite signal comprises a plurality of polarized signals, and wherein each portion of interest comprises a frequency or group of frequencies having a specified polarization.

3. The apparatus of claim 1, wherein the translator includes a plurality of mixers for mixing each selected portion of interest with respective oscillators from a selectable bank of oscillators, thereby translating each selected portion to respective adjacent frequency bands.

4. The apparatus of claim 3, wherein the frequencies of the oscillators of the selectable bank of oscillators are chosen so as to provide a guard interval between each predetermined frequency band.

5. The apparatus of claim 4, wherein the oscillator frequencies of the selectable bank of oscillators are in accordance with the following table:

| Oscillator Frequency | Frequency from Satellite | Frequency to receiver |
|---|---|---|
| 9.75 GHz | 10.7-11.2125 GHz | 0.95-1.4625 GHz |
| 10.2625 | 11.2125-11.725 | 0.95-1.4625 |
| 10.775 | 11.725-12.2375 | 0.95-1.4625 |
| 11.2875 | 12.2375-12.75 | 0.95-1.4625 |
| 9.0625 | 10.7-11.2125 | 1.6375-2.150 |
| 9.575 | 11.2125-11.725 | 1.6375-2.150 |
| 10.0875 | 11.725-12.2375 | 1.6375-2.150 |
| 10.6 | 12.2375-12.75 | 1.6375-2.150. |

6. The apparatus of claim 3, wherein the frequencies of the oscillators of the selectable bank of oscillators are chosen so as to provide no guard interval between each predetermined frequency band.

7. The apparatus block of claim 6, wherein the oscillator frequencies of the selectable bank of oscillators are in accordance with the following table:

| Oscillator Frequency | Frequency from Satellite | Frequency to receiver |
|---|---|---|
| 9.75 GHz | 10.7-11.2125 GHz | 0.95-1.4625 GHz |
| 10.2625 | 11.2125-11.725 | 0.95-1.4625 |
| 10.775 | 11.725-12.2375 | 0.95-1.4625 |
| 11.2875 | 12.2375-12.75 | 0.95-1.4625 |
| 9.0625 | 10.7-11.2125 | 1.6375-2.150 |
| 9.575 | 11.2125-11.725 | 1.6375-2.150 |
| 10.0875 | 11.725-12.2375 | 1.6375-2.150 |
| 10.6 | 12.2375-12.75 | 1.6375-2.150. |

8. The apparatus block of claim 3, further comprising a controller for controlling the selection of an oscillator from the selectable bank of oscillators for use with one of the plurality of mixers, wherein the selection is determined by the frequency of each portion of interest as defined in the following table:

| Oscillator Frequency | Frequency from Satellite | Frequency to receiver |
|---|---|---|
| 9.75 GHz | 10.7-11.2125 GHz | 0.95-1.4625 GHz |
| 10.2625 | 11.2125-11.725 | 0.95-1.4625 |
| 10.775 | 11.725-12.2375 | 0.95-1.4625 |
| 11.2875 | 12.2375-12.75 | 0.95-1.4625 |
| 9.0625 | 10.7-11.2125 | 1.6375-2.150 |
| 9.575 | 11.2125-11.725 | 1.6375-2.150 |
| 10.0875 | 11.725-12.2375 | 1.6375-2.150 |
| 10.6 | 12.2375-12.75 | 1.6375-2.150. |

9. The apparatus of claim 3, further comprising a controller for controlling the selection of an oscillator from the selectable bank of oscillators for use with one of the plurality of mixers, wherein the selection is determined by the frequency of each portion of interest as defined in the following table:

| Oscillator Frequency | Frequency from Satellite | Frequency to receiver |
|---|---|---|
| 9.75 GHz | 10.7-11.2125 GHz | 0.95-1.4625 GHz |
| 10.2625 | 11.2125-11.725 | 0.95-1.4625 |
| 10.775 | 11.725-12.2375 | 0.95-1.4625 |
| 11.2875 | 12.2375-12.75 | 0.95-1.4625 |
| 9.0625 | 10.7-11.2125 | 1.6375-2.150 |
| 9.575 | 11.2125-11.725 | 1.6375-2.150 |
| 10.0875 | 11.725-12.2375 | 1.6375-2.150 |
| 10.6 | 12.2375-12.75 | 1.6375-2.150. |

10. The apparatus of claim 1, and an external device, the external device being a receiver having a tuner.

11. A method comprising in a low noise block:
receiving a satellite signal at satellite frequencies;
receiving, from an external device, an indication of a plurality of portions of interest of the received satellite signal at satellite frequencies;
selecting said plurality of portions of interest of the received satellite signal at satellite frequencies;
translating each of said selected portions to respective adjacent predetermined frequency bands; and combining each of said predetermined frequency band to produce an output intermediate frequency signal.

12. The method of claim 11, wherein the received satellite signal comprises a plurality of polarized signals, and wherein each portion of interest comprises a frequency or group of frequencies having a specified polarization.

13. The method of claim 11, wherein the step of translating includes the step of mixing each selected portion of interest with respective oscillators from a selectable bank of oscillators, thereby translating each selected portion to respective adjacent frequency bands.

14. The method of claim 13, wherein the frequencies of the oscillators of the selectable bank of oscillators are chosen so as to provide a guard interval between each predetermined frequency band.

15. The method of claim 13, wherein the frequencies of the oscillators of the selectable bank of oscillators are chosen so as to provide no guard interval between each predetermined frequency band.

16. Apparatus comprising:
   a low noise block, the low noise block being operable to receive a satellite signal at satellite frequencies, to process the received signal and to produce an output intermediate frequency signal, the low noise block comprising:

means for receiving, from an external device, an indication of a plurality of portions of interest of the received satellite signal at satellite frequencies, means for selecting said plurality of portions of interest of the input signal;

means for translating each of said plurality of selected portions to respective adjacent predetermined frequency bands; and means for combining each of said predetermined frequency bands to produce said output intermediate frequency signal.

17. The apparatus of claim 16, wherein the received satellite signal comprises a plurality of polarized signals, and wherein each portion of interest comprises a frequency or group of frequencies having a specified polarization.

18. The apparatus of claim 16, wherein the translator includes a plurality of mixers for mixing each selected portion of interest with respective oscillators from a selectable bank of oscillators, thereby translating each selected portion to respective adjacent frequency bands.

* * * * *